(12) United States Patent
Hagiwara

(10) Patent No.: US 9,701,335 B2
(45) Date of Patent: Jul. 11, 2017

(54) ELECTRONIC CONTROL DEVICE

(71) Applicant: Hitachi Automotive Systems, Ltd., Hitachinaka-shi, Ibaraki (JP)

(72) Inventor: Katsumasa Hagiwara, Isesaki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/913,784

(22) PCT Filed: Aug. 20, 2014

(86) PCT No.: PCT/JP2014/071700
§ 371 (c)(1),
(2) Date: Feb. 23, 2016

(87) PCT Pub. No.: WO2015/040994
PCT Pub. Date: Mar. 26, 2015

(65) Prior Publication Data
US 2016/0244088 A1    Aug. 25, 2016

(30) Foreign Application Priority Data
Sep. 19, 2013   (JP) .................................. 2013-194530

(51) Int. Cl.
*H05K 5/00* (2006.01)
*B62D 5/04* (2006.01)
(Continued)

(52) U.S. Cl.
CPC ....... *B62D 5/0406* (2013.01); *H01R 12/7088* (2013.01); *H05K 5/0004* (2013.01);
(Continued)

(58) Field of Classification Search
CPC .. H05K 5/0004; H05K 5/0017; H05K 5/0047; B62D 5/0406
See application file for complete search history.

(56) References Cited

U.S. PATENT DOCUMENTS 4,449,165 A * 5/1984 Kaufman .................. H05K 7/20
361/723
5,986,880 A * 11/1999 Santeler ................ G06F 13/409
361/679.32
(Continued)

FOREIGN PATENT DOCUMENTS

JP    51-43887 U    3/1976
JP    1-130271 U    9/1989
(Continued)

OTHER PUBLICATIONS

International Search Report (PCT/ISA/210) issued in PCT Application No. PCT/JP2014/071700 dated Oct. 7, 2014 with English-language translation (four (4) pages).
(Continued)

*Primary Examiner* — Courtney Smith
*Assistant Examiner* — Christopher L Augustin
(74) *Attorney, Agent, or Firm* — Crowell & Moring LLP

(57) ABSTRACT

An electronic control unit includes a casing and a cover which are mutually bonded. A drive circuit board which drives a motor unit is fixed to the cover and, on the other hand, a control circuit board which controls the drive circuit board is fixed to the casing. An electrical connector which supplies an electric power to each board and a motor unit is attached on an opening section of the casing. First power supply terminals of this electrical connector and the motor unit and second power supply terminals of the drive circuit board are directly electrically connected by a bonding of both of casing and the cover.

2 Claims, 9 Drawing Sheets

(51) Int. Cl.
 *H01R 12/70* (2011.01)
 *H05K 3/00* (2006.01)
 *H05K 3/40* (2006.01)
 *H01R 12/52* (2011.01)

(52) U.S. Cl.
 CPC ......... *H05K 5/0017* (2013.01); *H05K 5/0047* (2013.01); *H05K 5/0069* (2013.01); *H01R 12/523* (2013.01); *H05K 3/0061* (2013.01); *H05K 3/4015* (2013.01); *H05K 2201/0999* (2013.01); *H05K 2201/1031* (2013.01); *H05K 2201/10409* (2013.01); *Y02P 70/611* (2015.11)

(56) References Cited

U.S. PATENT DOCUMENTS

| | | | | |
|---|---|---|---|---|
| 6,756,711 | B2* | 6/2004 | Matsuyama | H02K 5/225 310/68 B |
| 6,791,170 | B1 | 9/2004 | Fuku et al. | |
| 8,378,211 | B2* | 2/2013 | Oka | H02G 3/086 174/50 |
| 8,959,908 | B2 | 2/2015 | Kikuchi et al. | |
| 2002/0000645 | A1* | 1/2002 | Sato | H01L 25/105 257/666 |
| 2004/0121655 | A1* | 6/2004 | Ling | H01R 23/688 439/682 |
| 2005/0014421 | A1* | 1/2005 | Sweetland | H01R 4/58 439/775 |
| 2008/0182436 | A1* | 7/2008 | Rathburn | H01R 13/2414 439/78 |
| 2012/0146208 | A1 | 6/2012 | Shinkai | |
| 2013/0249335 | A1* | 9/2013 | Motoda | B62D 5/0406 310/71 |

FOREIGN PATENT DOCUMENTS

| | | |
|---|---|---|
| JP | 2000-307056 A | 11/2000 |
| JP | 2001-326477 A | 11/2001 |
| JP | 2004-357129 A | 12/2004 |
| JP | 2006-66123 A | 3/2006 |
| JP | 2010-132102 A | 6/2010 |
| JP | 2012-124294 A | 6/2012 |

OTHER PUBLICATIONS

Japanese Office Action issued in counterpart Japanese Application No. 2013-194530 dated Aug. 2, 2016 (three (3) pages).

\* cited by examiner

ELECTRONIC CONTROL DEVICE

TECHNICAL FIELD

The present invention relates to an electronic control device and, for example, relates to the electronic control device which applies to drivingly control an electrically driven motor for such as an electrically driven power steering device (EPS) for a vehicle.

BACKGROUND ART

As an electronic control device mounted on the vehicle such as, for example, an electrically driven power steering device, such a structure is known, for example, in a patent document 1 in which a circuit board on which various kinds of electronic parts are mounted is housed in a space of an inside of a cabinet constituted by a plurality of cabinet members (for example, a casing, a cover, and so forth as will be described later) and both of a terminal mounted on the circuit board and other various kinds of terminals (for example, power supply terminals of a bus bar or so forth) are mutually electrically connected by means of a wire bonding or welding (a welding to which a direct current bus bar is applied).

In addition, in order to achieve a small sizing of the electronic control device, such a structure has been discussed in which both terminals are merely not connected as described above by means of the wire bonding or welding but, for example, a tuning fork terminal such as described in a patent document 2 is applied to either one of both terminals and both terminals can be connected from mutually opposite directions (in patent document 2, a connection is made between an input terminal (a reference numeral 14) of a circuit breaker and the tuning fork terminal (a reference numeral 38) of a thin thickness structure).

Pre-published Document

Patent Document

Patent document 1: A Japanese Patent Application First Publication (Tokkai) 2010-132102.
Patent document 2: A Japanese Patent Application First Publication (Tokkai) 2012-124294.

DISCLOSURE OF THE INVENTION

However, in both terminals described above connected from the mutually opposite directions, a load is applied during the connection. Hence, in a case where the tuning fork terminal (the terminal of a thin thickness structure) is merely applied to either one of both terminals, there is a possibility that a connection reliability is reduced due to an unstable connection. Although it is considered that the connection reliability is increased by making the tuning fork terminal thicker, in order to endure the above-described load, or by reinforcing a support structure of the tuning fork terminal (reinforcing using the bus bar), this brings a large sizing of the device.

The present invention is provided to solve the above-described problem of a conventional art. The problem to be solved by the present invention is that the terminal mounted on the circuit board and the other various kinds of terminals can be connected with a sufficient connection reliability and it can contribute on the small sizing of the device.

An electronic control device according to the present invention is a creature that the above-described problem can be solved. According to one aspect of the present invention, there is provided an electronic control device in which a circuit board on which electronic parts are mounted is housed within a cabinet having bondable two cabinet members positioned mutually opposing directions, the circuit board being mounted on one of the cabinet members, the electronic control device comprising: a first terminal disposed on the other of the cabinet members; and a second terminal mounted on the circuit board, the first terminal and the second terminal being connected by a bonding of the two cabinet members, the second terminal having: a bottom surface section fixed to a land section of the circuit board through an electrical bonding; a pair of bending sections which stand up from both end sides of the bottom surface section and bent in directions mutually approaching to each other; and a pair of connection sections formed on tip sides of the respective bending sections and positioned to oppose against each other and a tip side of the first terminal being press fitted into a space between the pair of connection sections from a stand up direction side of the bending sections to be connected to the pair of connection sections.

According to the present invention, the other various kinds of terminals are connected to the terminal mounted on the circuit board with a sufficient connection reliability and it can contribute on the small sizing of the device.

EMBODIMENTS FOR CARRYING OUT THE INVENTION

An electronic control device in a preferred embodiment according to the present invention includes bondable two cabinet members positioned in mutually opposing directions, a circuit board being installed and housed in one of the two cabinet members.

A first terminal (corresponds to first power supply terminals 25, 3e as will be described later) disposed on the other of the two cabinet members and a second terminal mounted on the circuit board (corresponds to second power supply terminals 35, 37 as will be described later) can be connected together having a sufficient connection reliability (can be connected without use of a tuning fork terminal or so forth). In addition, the electronic control device in the preferred embodiment according to the present invention can contribute on a small sizing of the device.

Figure 7:
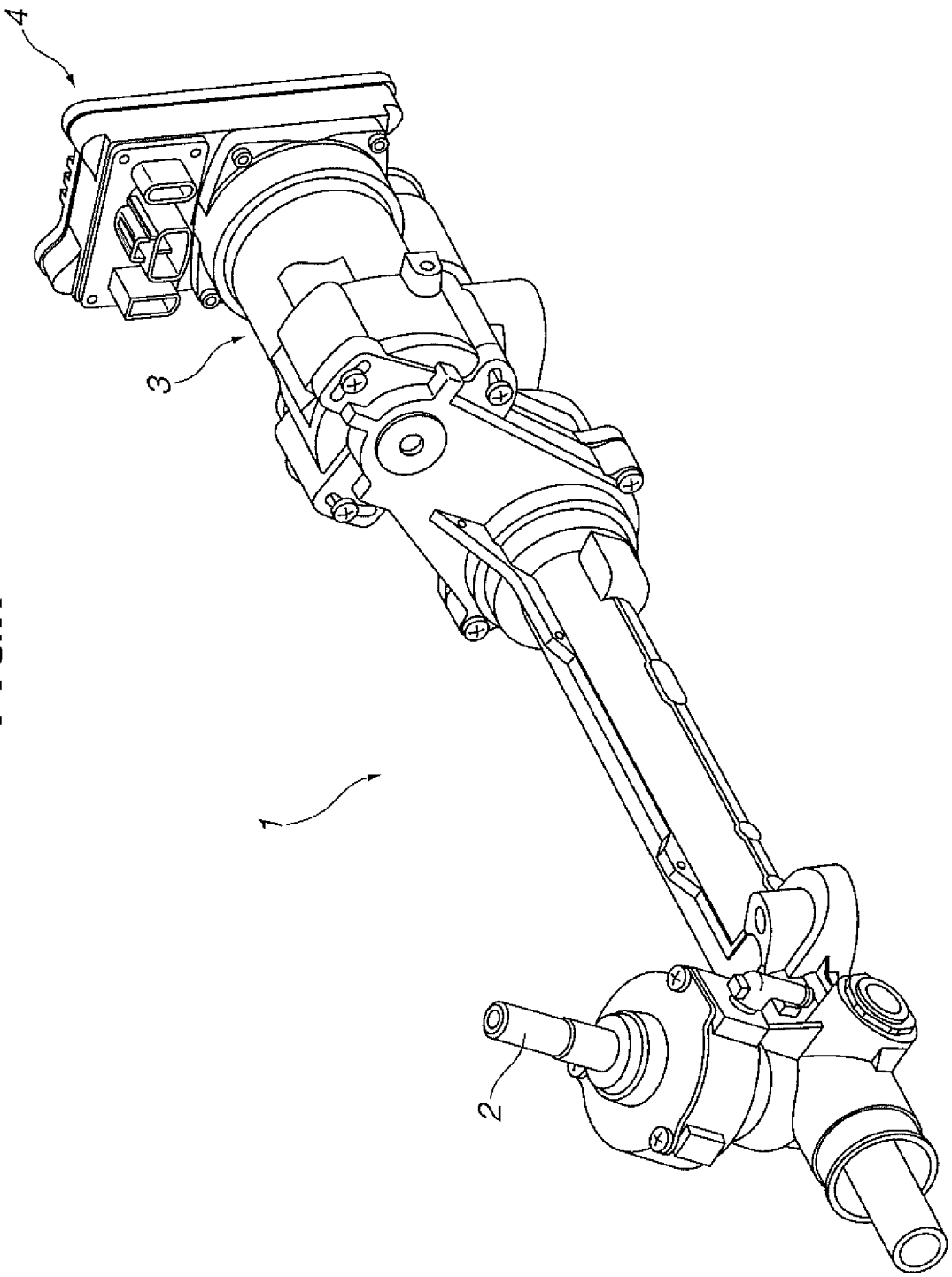
FIG. 7 is a structural view of a power steering device.

Hereinafter, the electronic control device in the preferred embodiment according to the present invention will be explained on a basis of an application example thereof to an electrically driven power steering device. That is to say, as shown in FIG. 7, electrically driven power steering device 1 includes: an input axle 2 to which a steering torque is inputted from a steering wheel; and a motor unit 3 which provides an assistance torque for the steering torque. Motor unit 3 is drivingly controlled by means of an electronic control unit (ECU) 4. It is possible to apply the electronic control device in the preferred embodiment to this electronic control unit 4.

<<Application Example of the Electronic Control Device in the Preferred Embodiment>>

Electronic control unit 4 in FIGS. 1 through 7 is disposed on, for example, a basic end section side (an opposite side to a terminal of an output side, namely, a terminal section of a side corresponding to a control circuit board 8 as will be described later) of a shaft 3a of motor unit 3.

This motor unit 3 includes: an electrically driven motor not shown (a three phase alternating current type brushless motor); a motor housing 3c housing the electrically driven motor; shaft 3a rotationally driven by means of the electrically driven motor; a magnet S attached onto the base end section of shaft 3a for detecting a rotation of shaft 3a with a Hall effect device 47 as will be described later; and first power supply terminals 3e (three phase motor terminals) connected to respective terminals of the three phases of the motor. This shaft 3a is revolved by the drive of the electrically driven motor and provides the assistance torque for the steering torque via a speed reducer (not shown). In addition, an exterior section 3f having a large outer dimension is formed on motor housing 3c facing against electronic control unit 4 side.

Specifically, electronic control unit 4 includes: a casing (cabinet member) 5 fixed to exterior section 3f of motor housing 3c; a cover (cabinet member) 6 joined (bonded) with casing 5; a drive circuit board 7 housed between both of casing 5 and cover 6 for driving the electrically driven motor; a control circuit board 8 housed between both of casing 5 and cover 6 for controlling the drive of drive circuit board 7; and an electrical connector 9 supplying an electrical power to respective circuit boards 7, 8 and the electrically driven motor from a power supply battery not shown.

(1) Casing 5

Figure 1:
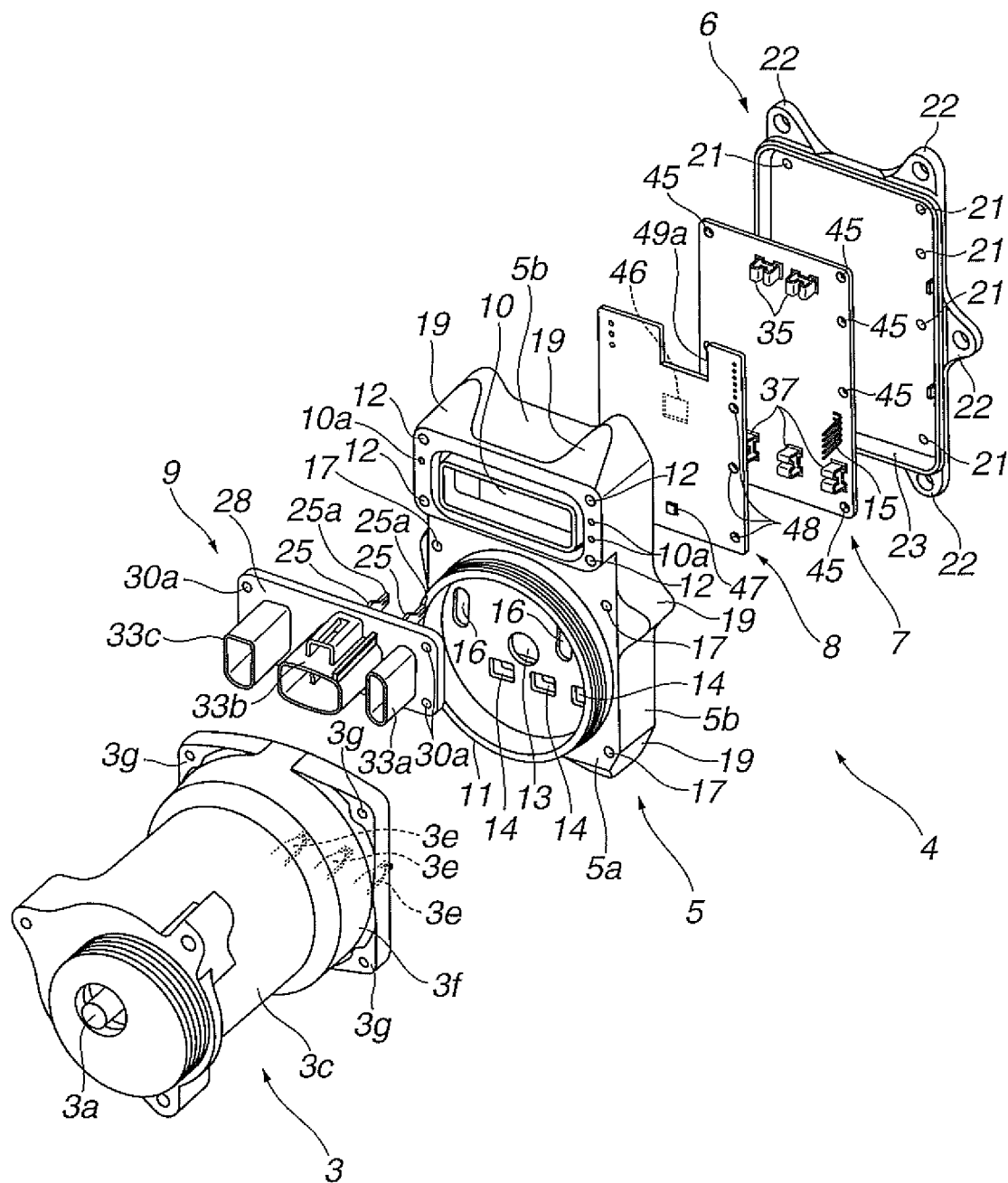
FIG. 1 is an exploded perspective view of an electronic control unit in a preferred embodiment according to the present invention.

Casing 5 is a part of the cabinet housing circuit boards 7, 8. Casing 5 is made of, for example, an aluminum alloy material. Casing 5 is formed in a box shape whose upper part is opened. Casing 5 includes a bottom plate 5a and side plates 5b installed vertically from respective edge sections of bottom plate 5a. As shown in FIG. 1, an upper part of bottom plate 5a is projected toward an opposite direction to side plates 5b.

An opening section 10 on which electrical connector 9 is attached is formed on this upper part of bottom plate 5a. Hole sections 10a are installed on an outer peripheral edge of opening section 10. Female screws 12 for fixing electrical connector 9 are formed on four corners of the upper part of bottom plate 5a facing motor housing 3c.

In addition, a circular joint section 11 to be fitted into an opening section 3d of exterior section 3f is formed on a lower part of bottom plate 5a facing motor housing 3c. Female screw holes 17 for fixing to exterior section 3f are formed on four corners of the lower part of bottom plate 5a. Axle sections of fixture screws not shown inserted into penetrating holes of exterior section 3f are engaged with female screw holes 17.

A circular opening section 13 for housing sensor purpose magnet S attached onto the base end section (shaft base end section) of shaft 3a is formed on a center of joint section 11. Three lateral length longer rectangular shaped opening sections 14 through which first power supply terminals (three phase motor terminals) 3e are inserted are formed on the lower part of opening section 13. A pair of longitudinally length longer rectangular shaped opening sections 16 which expose to a tip section of power supply terminal 15 connecting both circuit boards 7, 8 are formed on left and right oblique upper sides of opening section 13.

A plurality of cylindrical shaped board fixing section 18 for fixing control circuit board 8 are installed vertically from bottom plate 5a facing cover 6 side. It should be noted that a fitting groove 20 is installed along an outer profile of casing 5 on an upper end section of each side plate 5b and a boss section 19 is formed at a predetermined position of the outer surface of each side plate 5b.

(2) Cover 6

Figure 2:
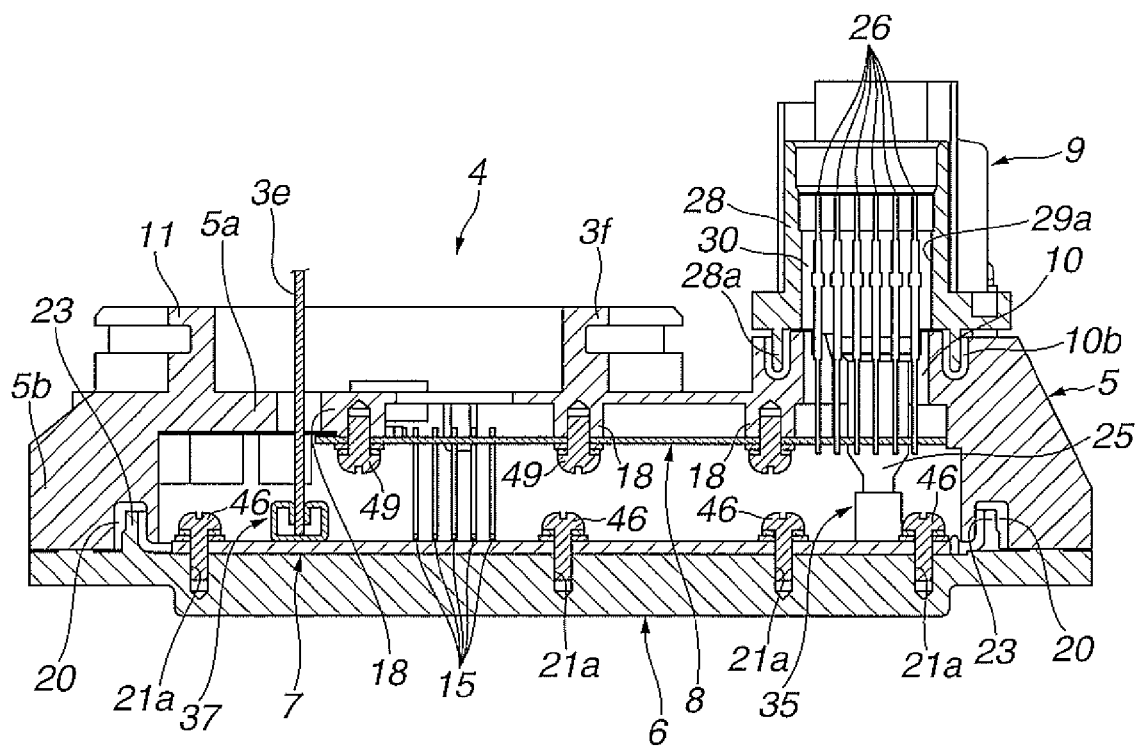
FIG. 2 is a longitudinally cross sectioned view of an essential part of the electronic control unit in a state in which the electronic control unit is attached to a motor unit.
Figure 3:
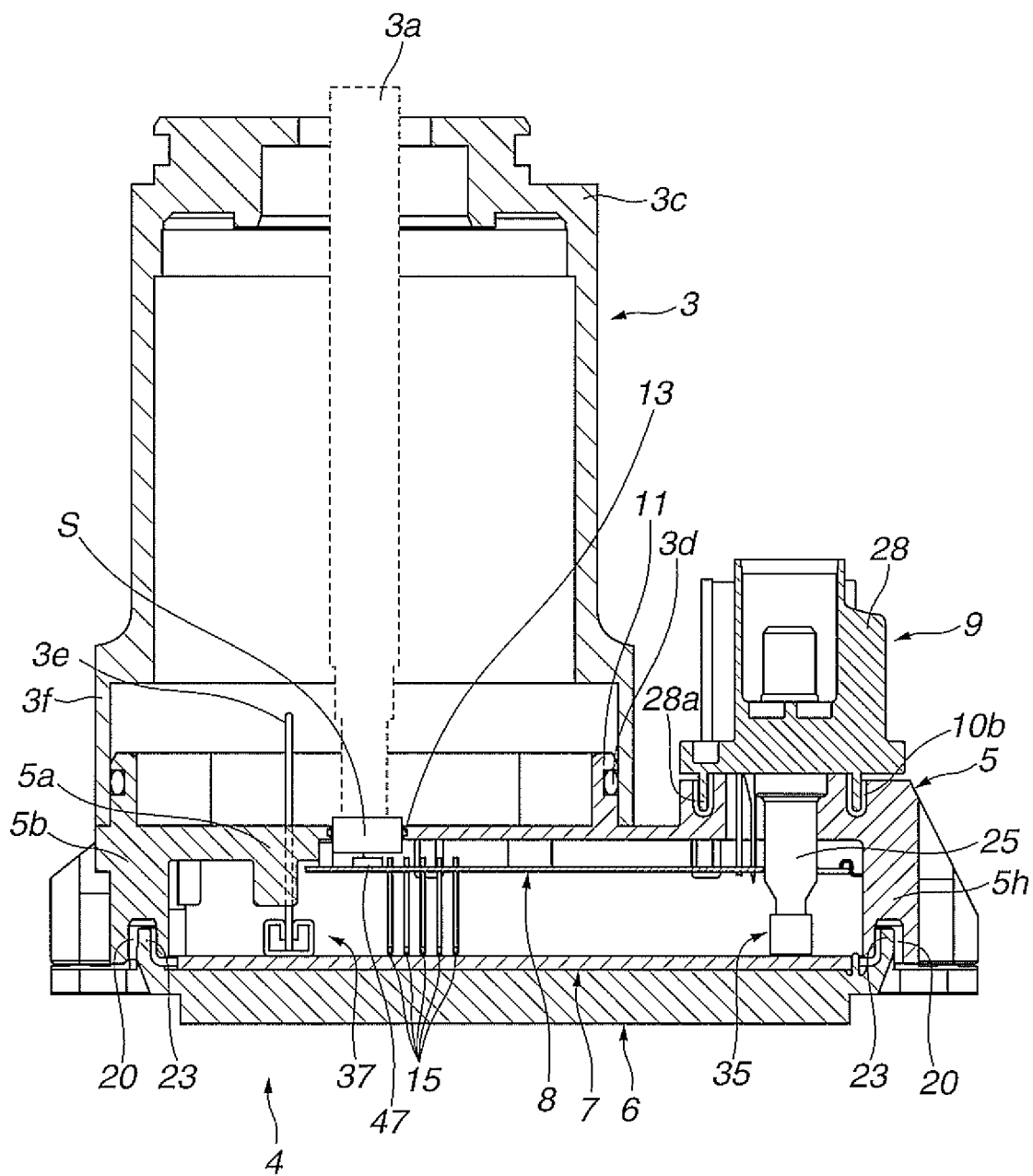
FIG. 3 is a longitudinally cross sectioned view of the electronic control unit.

Cover 6 is, for example, formed in a rectangular shape along an outer profile of cover 5 as shown in FIGS. 1 through 3. Cover 6 is made of the aluminum alloy material or so forth. Cover 6 encloses an opening section of casing 5. A fitting projection section 23 to be fitted into a fitting groove 20 is installed along an outer profile of an edge section of cover 6 facing toward casing 5 side.

A female screw 21 group fixing drive circuit board 7 to cover 6 is formed on left and right edge sections of cover 6. Boss sections 22 are formed on positions of respective end surfaces of cover 6 corresponding to boss sections 19. Penetrating holes not shown are formed on boss sections 22. Shank sections of fixture screws not shown inserted through the penetrating holes are engaged with female screw holes of boss sections 19. It should be noted that a heat sink not shown is formed on a part of cover 6 which is opposite to casing 5.

(3) Electrical Connector 9

Electrical connector 9 is attached onto an outer peripheral edge of opening section 10 of casing 5. Electrical connector 9, as shown in FIGS. 1 through 3 and FIG. 5, includes: a pair of first connectors C1 in each of which a substantial center section of connector side first power supply terminal (power supply terminal) 25 is resin sealed; a first connector C2 in which the substantial center section of various kinds of signal terminals (torque/S, ignition SW, and so forth) 26 is resin sealed; a first connector C3 in which the substantial center section of CAN communication purpose terminals 27 is resin sealed; and a second connector 28 to which first connectors C1 through C3 are fixed. Opening section 10 is closed by second connector 28.

This second connector 28 is constituted by a connector holder holding first connectors C1 through C3. Three attaching holes 29a in which first connectors C1 through C3 are inserted are penetrated on second connector 28. An outer periphery of each of resin parts 30 of first connectors C1 through C3 is connected to an inner surface of each attaching hole 29a and first connectors C1 through C3 are held and fixed to second connector 28. Specifically, when both of first connectors C1 through C3 and second connector 28 are connected, each of first connectors C1 through C3 in which the substantial center section of terminals 25 through 27 is resin sealed is inserted into each attaching hole 29a of second connector 28 and connected. After this connection, an adhesive (seal agent) is applied to a gap between both of first connectors C1 through C3 and second connector 28 so that a water proof characteristic of the gap and a bonding force between the first connector C1 through C3 and second connector 28 are strengthened.

Through the bonding of both of first connectors C1 through C3 and second connector 28 finishes electrical connector 9 and attached on the outer peripheral edge of opening section 10.

At this time, an attaching section 28a is installed at casing side 5 of second connector 28 and is inserted within a peripheral groove 10b formed on the outer peripheral edge of opening section 10. On the other hand, connector fitting sections 33a, 33b, 33c are formed on an opposite side of second connector 28 to casing 5. Penetrating holes 30a are formed on four corners of second connector 28. The shank section of fixture screw not shown inserted through each penetrating hole 30a is engaged with a female screw hole 12 of casing 5. A pin 31 is formed which is inserted in hole section 10a of casing 5 between each penetrating hole 30a of both end sections. Since pin 31 and hole section 10a are formed by numbers asymmetrically with left and right, electrical connector 9 is prevented from erroneously attached left and right positions.

One end sections of terminals 25 through 27 (one end section of terminal 25, for example, corresponds to one end section 90 in FIG. 9; hereinafter, reference signs are appropriately omitted) are disposed on drive circuit board 7 side and, on the other hand, the other end sections of terminals 25 through 27 are disposed within connector fitting sections 33a, 33b, 33c.

Figure 5:
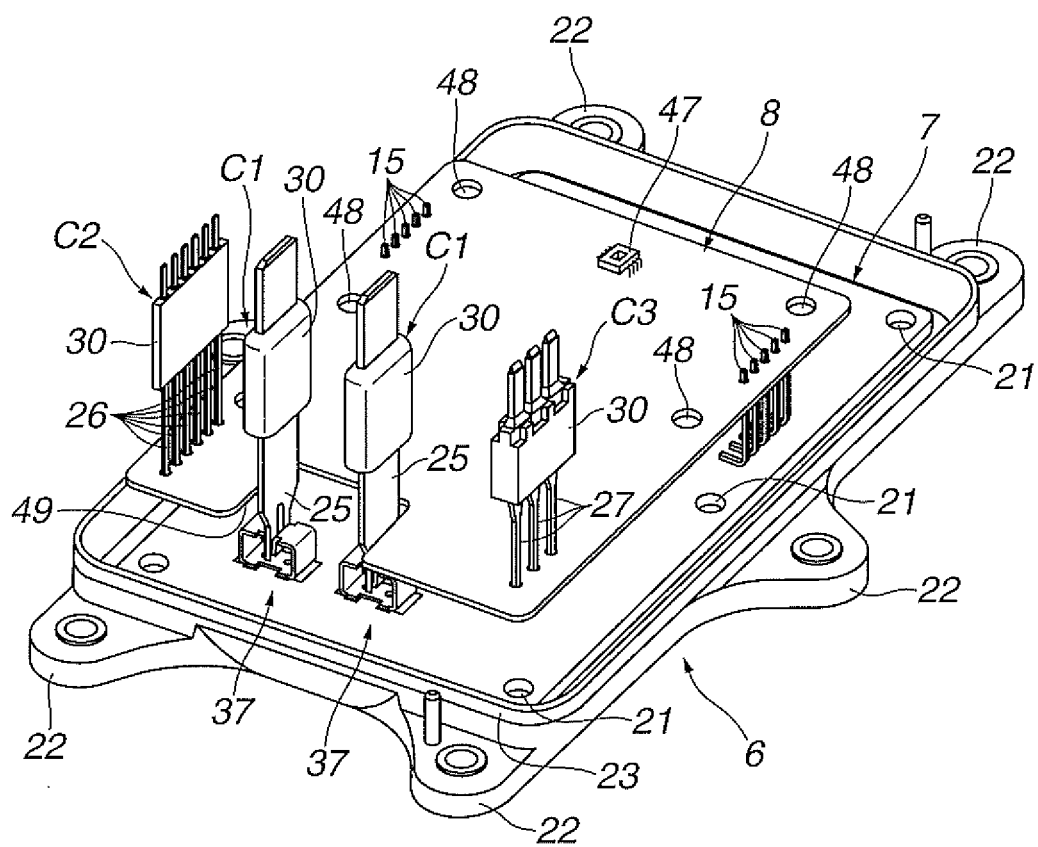
FIG. 5 is a perspective view of a joint section of a casing.

In addition, for example, as shown in FIGS. 3 and 5, one end section of terminals 26, 27 is formed in a pin shape and one end section of first power supply terminal 25 is in a tapered band shape and has a tip cut out in a letter of V shape. A tip inner surface of a pair of grasping sections 25a is formed in a taper shape. One end section of three phase side first power supply terminal 3e (one end section of terminals 3e corresponds, for example, to one end section 90 in FIG. 9; hereinafter, reference signs and so forth will be omitted) has the tapered shape in the same way.

It should be noted that a corresponding connector fitting section formed on the electrical connector of an external equipment (for example, a power supply battery or so forth) (not shown) is fitted to each connector fitting section 33a, 33b, 33c and the other end sections of respective terminals 25 through 27 are electrically connected with the terminals of the electrical connector of the external equipment.

(4) Drive Circuit Board 7

Drive circuit board 7 relates to a power module which converts the electrical current supplied from electrical connector 9 into a three phase alternating current (U phase, V phase, W phase) and drives the electrically driven motor in accordance with a control signal from control circuit board 8.

Figure 4:
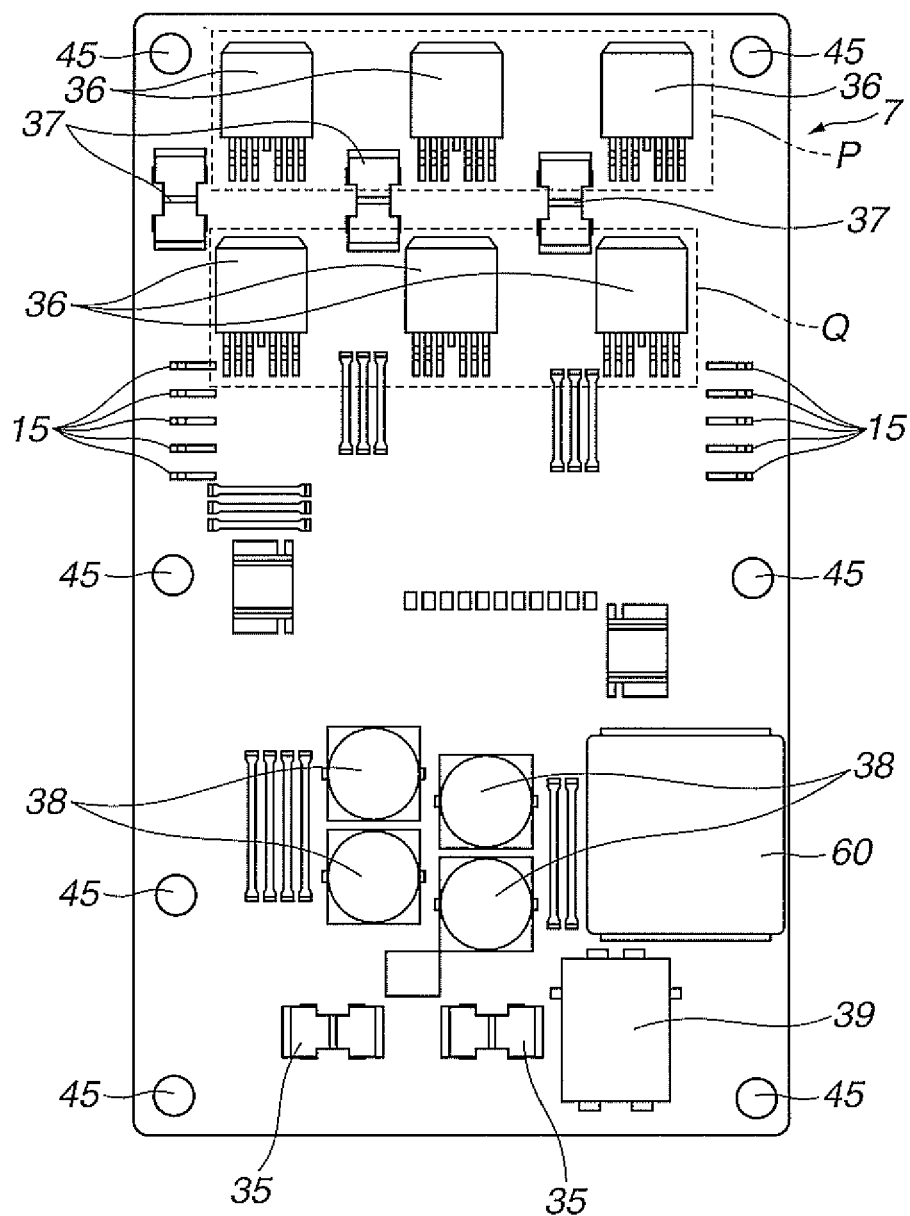
FIG. 4 is a plan view of a drive circuit board.

A wire pattern not shown is formed on a board of drive circuit board 7 made of a metallic material via an insulating layer. As shown in FIG. 4, power supply purpose second power supply terminals 35 which are electrically connected with the one end sections of respective first power supply terminals 25, drive transistors 36 (drive elements, switching elements) in which upstream side P and downstream side Q are serially electrically connected for each phase of the three phase alternating current, and three phase motor purpose second power supply terminals 37 which are electrically connected with one end sections of respective first power supply terminals 3e are actually mounted on drive circuit board 7.

That is to say, drive transistors 36 are actually mounted on drive circuit board 7 in an arrangement of "two (a set of a pair of upstream and downstream sides P and Q)×three sets (corresponds to three phase)". Second power supply terminals 37 are arranged between each of upstream side drive transistors 36 of each set and each of downstream side drive transistors 36 of each set to supply the three phase alternating current to each of first power supply terminals 3e. A shown in FIG. 3, each second power supply terminal 36 is disposed to oppose against one end section of first power supply terminal 25 and each second power supply terminal 37 is disposed to oppose against one end section of each first power supply terminal 3e.

Electronic parts such as smoothing capacitors 38, a fail safe purpose relay 39 provided when a failure occurs, a coil 60, and so forth are actually mounted on drive circuit board 7. These smoothing capacitors 38 smooth the current supplied by the connection of both power supply terminals 25, 35 and supplies the smoothed current to respective drive transistors 35.

Base end sections of power supply terminals 15 are electrically joined (bonded) to left and right edges of drive circuit board 7 and a penetrating hole 45 group for fixing purpose to cover 6 is formed. Shank sections of fixture screws 49 inserted into respective penetrating holes 45 are engaged with female screw holes 21a of cover 6 as shown in FIG. 2.

(5) Second Power Supply Terminals 35, 37

Figure 6:
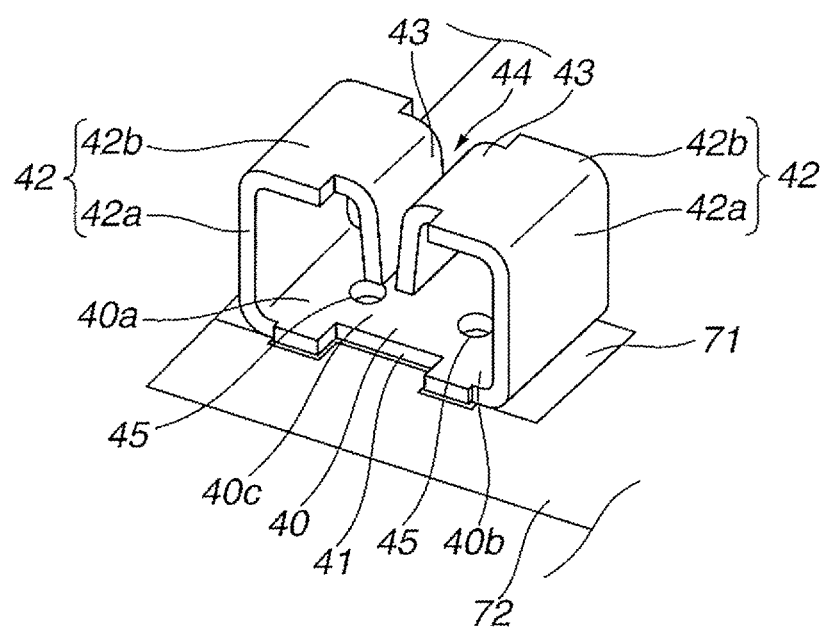
FIG. 6 is a perspective view of each of second power supply terminals.

Each of second power supply terminals 35, 37 is formed by bending a metallic plate material such as a copper material. Each of second power supply terminals 35, 37, as shown in FIG. 6, includes; a bottom surface section 40 fixed by an electrical bonding to a land section 71 formed on a predetermined position of drive circuit board 7; a pair of bending sections 42 which stand up from both ends 40a, 40b of bottom surface section 40 and are bent in directions mutually approaching to each other (hereinafter a bending section approaching direction); and a pair of connection sections 43 formed on tip sides of respective bending sections 42 and positioned in mutually opposing directions to each other (opposing in the bending section approaching direction). One end sections of first power supply terminals 25 and one end sections of first power supply terminals 3e are inserted under pressure (press fitted) into gap sections 44 between respective connection sections 43 so as to enable electrical connections between them.

It is possible to form land section 71, for example, by opening a desired position in accordance with a shape of bottom surface section 40 in a mask formed by masking a photoresist or so forth on one end surface side of drive circuit board 7. Since respective second power supply terminals 35, 37 are fixed by electrically bonding this land section 71 to bottom surface section 40, as compared with a case where a tuning fork terminal or so forth is used, it is easy to secure a fixture support area (a bonding area between land section 71 and bottom surface section 40) and it is possible to obtain a stable connection structure.

Each bending section 42 includes: a stand-up section 42a projected toward a thickness direction of drive circuit board 7 from either both ends 40a or 40b side positioned mutually opposing in bottom surface section 40; and an extension section 42b extended from a tip side of each stand-up section 42a toward the bending section approaching direction. The insertion under pressure (the press fit) of one end section of first power supply terminal 25 and one end section of each first power supply terminal 3e with respect to gap section 44 between each of connection sections 43 (insertion (press fit)

from a stand-up direction side of stand-up section 42a under pressure) causes an elastic deformation.

A distance between each connection section 43 (a width of gap section 44) is set to be smaller than a cross sectional surface direction dimension of one end section of first power supply terminal 25 and one end section of each first power supply terminal 3e. Thus, both terminals 25, 3e are set to be inserted into gap section 44 under a predetermined press fitting force. That is to say, the distance between each connection section 43 is expanded and each bending section 42 is elastically deformed to be inserted under pressure (press fit) after the press fitting, both terminals 25, 3e are set to be grasped by means of each connection section 43 under a predetermined grasping force. That is to say, as described above, a restoration action of each bending section 42 which has been elastically deformed can be set to be acted as the grasping force. Hence, since each bending section 42 can be designed so that the grasping force gives a desired magnitude, it can contribute on the connection reliability.

In addition, each connection section 43 is, as shown in FIG. 6, formed to be bent from a tip side of each bending section 42 (in FIG. 6, a tip side of each extending section 42b) toward bottom surface section 40 side. One end section of first power supply terminal 25 and one end section of each first power supply terminal 3e is easy to be press fitted into gap section 44 along an extension direction of each connection section 43. In addition, one end section of each terminal 25, 3e press fitted is easy to be grasped by means of each connection section 43.

(6) Control Circuit Board 8

Control circuit board 8 is constituted by a printed circuit board (glass epoxy board) or a ceramic board. This control circuit board 8, for example, as shown in FIG. 1, includes: a microcomputer (CPU: hereinafter, abbreviated as micon) 46 controlling each drive transistor 36; and a Hall effect device 47 detecting a revolution of the electrically driven motor.

This micon 46 is mounted on a surface of control circuit board 8 facing against drive circuit board 7. On the other hand, Hall effect device 47 is mounted on an opposite surface to micon 46, namely, mounted on an opposing surface of a sensor magnet S housed in opening section 13 of casing 5. Both devices 46, 47 are electrically connected via a circuit pattern of control circuit board 8, the circuit pattern providing a signal transmission route between both devices 46, 47.

That is to say, Hall effect device 47 is disposed at a position of one end side of control circuit board 8 which faces against sensor magnet S, detecting the magnetic field of sensor magnet S utilizing a Hall effect to detect the revolution of shaft 3a. This detection signal is inputted to micon 46 via the circuit pattern of control circuit board 8.

In addition, for example, as shown in FIG. 2, in one end side of control circuit board 8, tip sections of power supply terminals 15 are inserted and electrically connected by means of soldering or welding. On the other hand, as shown in FIG. 1, a cut out section 49a is formed to pass through one end section of power supply terminal 25 to drive circuit board 7 side, on the other end side of control circuit board 8. In both sides of cut out section 49a, one terminal section of both terminals 26, 27 is inserted and electrically connected.

Hence, micon 46 controls drive transistors 35 on a basis of an information (for example, steering torque, vehicle speed signal, and so forth) inputted from an external via both terminals 26, 27 of electrical connector 9 and a detection signal of Hall effect device 47.

It should be noted that a penetrating hole 48 group is formed on left and right edge sections of control circuit board 8. As shown in FIGS. 2 and 3, the shank section of a fixture screw 49 inserted into each penetrating hole 48 is engaged with a female screw hole of a board fixture section 18 of casing 5.

(7) Assembly Procedure

Hereinafter, an assembly procedure of electronic control unit 4 will be explained.

First, control circuit board 8 and electrical connector 9 are attached on casing 5 and drive circuit board 7 is attached on cover 6.

When control circuit board 8 is attached, the shank section of fixture screw 49 is inserted into each penetrating hole 48 of control circuit board 8 with Hall effect device 47 opposed to opening section 13 of cover 6. Thereafter, the shank section of each fixture screw 49 is engaged with a female screw hole of each board fixture section 18 of casing 5.

When electrical connector 9 is attached, a substantial center section of each terminal 25 through 27 is attached onto an outer peripheral edge of opening section 10 of casing 5 after each first connector C1 through C3 is inserted into a second connector 28 and the bonding is ended. That is to say, an attaching section 28a of connector holder 28 is fitted into a peripheral groove 10b of casing 5 and pin 31 is fitted into hole section 10a. Thereafter, the shank section of the fixture screw is inserted into penetrating hole 30a to engage with female screw hole 12. Thereafter, one end section of terminals 26, 27 is electrically bonded to control circuit board 8. When drive circuit board 7 is attached, the shank section of fixture screw 49 is inserted into penetrating hole 45 of drive circuit board 7 to engage with screw hole 21 of cover 6.

Next, casing 5 onto which electrical connector 9 and control circuit board 8 are attached and cover 6 onto which drive circuit board 7 is attached are assembled. In this assembly operation, one end section of first power supply terminal 25 at the connector side is opposed against power supply purpose second power supply terminal 35 mounted on drive circuit board 7 via cut out section 49 of control circuit board 8. In this state, a fitting projection section 23 of cover 6 is fitted into a fitting groove 20 of casing 5 to fit both groove and projection section 20, 23.

At this time, one end section of first power supply terminal 25 is press fitted into gap section 44 between each connection section 43 of second power supply terminal 35 due to a fitting force of fitting projection section 23 to fitting groove 20. That is to say, one end section of first power supply terminal 25 is press fitted into gap section 44 elastically deforming each bending section 42 of second power supply terminal 35 during the assembly of casing 5 and cover 6 and is grasped with the grasping force due to the restoration action of each bending section 42 which has been elastically deformed. Hence, at the same time when fitting projection section 23 of cover 6 is fitted into fitting groove 20 of casing 5, one end section of first power supply terminal 25 is press fitted into gap section 44 between each connection section 43 of second power supply terminal 35 and grasped by each connection section 43 to be electrically bonded. Thus, both of first and second power supply terminals 25, 35 are directly (electrically) connected.

Since, in this way, second power supply terminal is applied, both of first and second power supply terminals can be connected with a sufficient connection reliability. In addition, since it is not necessary to apply the tuning fork terminal to both of first and second power supply terminals 25, 35, in this respect, it can contribute on the small sizing of the device. Furthermore, one end section of first power supply terminal 25 is merely grasped and connected by each connection section 43, namely, is connected so as to enable insertion and extraction. Hence, even if both of first and second power supply terminals 25, 35 are mutually electrically connected, both of first and second power supply terminals 25, 35 can easily be inserted or extracted. An electrical inspection of electronic control unit 4 and a motor characteristic inspection are easily carried out in insertion and extraction states.

During the assembly operation of casing 5 and cover 6, for example, as shown in FIG. 5, tip sections of respective power supply terminals 15 are inserted through control circuit board 8 and housed within left and right opening sections 16 of casing 5 as shown in FIG. 1. Hence, after casing 5 and cover 6 are assembled, respective power supply terminals 15 can be connected to control circuit board 8 by electrical bonding through soldering, welding, or so forth. In this respect, control circuit board 8 and drive circuit board 7 can be disposed in a lamination state. After this electrical bonding operation, the shank section of the fixture screw is inserted through the penetrating hole of boss section 22 of cover 6 and this shank section is engaged with the female screw hole of boss section 19 of casing 5 so that both of casing 5 and cover 6 are joined and the assemble operation is ended.

Then, electronic control unit 4 is attached onto motor unit 3 after such an assembly operation as described above. During this operation, joint section 11 of casing 5 is opposed against opening section 3d of exterior section 3f and, thereafter, joint section 11 is fitted into opening section 3d. At this time, one end section of each first power supply terminal 3e is opposed against each opening section 14 of casing 5. Hence, in the same way as second power supply terminal 35, at the same time of the fitting of joint section 14, one end section of each first power supply terminal 3e is press fitted into gap section 44 between each connection section 43 of second power supply terminal 37 and grasped by respective connection sections 43 to be electrically bonded so that both of first power supply terminals 3e, 37 are directly (electrically) connected. In this respect, in the same way as application of second power supply terminals 35, both power supply terminals 3e, 37 can be connected having a sufficient connection reliability and can contribute on the small sizing of the device. In addition, the electrical inspection of electronic control unit 4 and the motor characteristic inspection are easily carried out in the insertion and extraction state.

It should be noted that, in a case where power supply terminal 25 and so forth is connected with drive circuit board 7 on a basis of, for example, patent document 1, power supply terminal 25 is connected with drive circuit board 7 by applying a wire bonding or a direct current bus bar for a welding. By applying power supply terminals 35, 37 having the structure as shown in FIG. 6 or so forth, the wire bonding and the direct current bus bar for the welding are not needed. In this respect, as compared with patent document 1, it can be said that the number of parts for the electronic control unit are reduced and this electronic control unit can contribute on a low cost of the device. In addition, the reduction of the number of parts can contribute on a simplification of a manufacturing labor hour and can reduce a labor.

Next, the shank section of the fixture screw is inserted into the penetrating hole of boss section 3g and this shank section is engaged with female screw hole 17 of casing 5 so that electronic control unit 4 is attached onto motor housing 3c. In this case, since the electrically driven motor and the power module are fixed to a different cabinet member (casing 5 or cover 6), a heat interference generated thereat can be suppressed and this can contribute on an improvement on a heat dissipation.

In addition, since second power supply terminal 37 is disposed between upstream side P drive transistor 36 and downstream side Q drive transistor 36 in view of the disposition of the parts of drive circuit board 7, a disposition interference between shaft 3a of the electrically driven motor and second power supply terminal can be suppressed. Furthermore, since the wiring distance between respective drive transistor 36 and second power supply terminal 37 can be shortened, a complication of the wiring can be suppressed.

It should be noted that the assembly procedure of electronic control unit 4 is not specifically limited to the above described procedure. Motor unit 3 and casing 5 may first be assembled and, thereafter, casing 5 and cover 6 may be assembled.

<<Modification>>

For example, each of second power supply terminals 35, 37, as described on a basis of FIG. 6 and so forth, includes: bottom surface section 40 fixedly connected to land section 71 at a predetermined position of drive circuit board 7; a pair of bending sections 42 stand up from both ends of bottom surface section 40 and bent mutually in the bending section approaching direction; and a pair of connection sections 43 formed on tip sides of respective bending sections 42 and positioned mutually opposite to each other. It is possible to appropriately modify the design if each kind of terminals to be connected (for example, one end section of first power supply terminal 25, 3e) is press fitted into a space between the pair of connection sections 43 from the stand up direction side of bending sections 42 so as to enable the electrical connection.

As, in the pair of bending sections 42 shown in FIG. 6 and so forth, in a case of a structure having: stand up sections 42a; and extending sections 42b extended from tip sides of stand up sections 42a toward the bending section approaching direction, extending sections 42b are positioned so as to oppose against bottom surface section 40. This extending sections 42b are flat as shown in FIG. 6 and so forth so as to have a shape that can be absorbed by a suction type automatic parts mounting machine. If so, it is possible to automatically mount second power supply terminals 35, 37 on a predetermined position of drive circuit board 7 utilizing extending sections 42b. This can contribute on the simplification of the manufacturing labor hour of the device and the working labor can be reduced.

Bottom surface section 40 may electrically be bonded and fixed to land section 71. An electrically conductive bond material (not shown) such as soldering may be intervened between bottom surface section 40 and land section 71 to electrically bond these sections (soldering or so forth) or may electrically be bonded by such as the welding. In a case where each kind of electronic parts (smoothing capacitor 38 and so forth) mounted on circuit board 7 is electrically bonded by means of electrically conductive material such as soldering, it is possible to electrically bond between bottom surface section 40 and land section 71 (electrical bonding by means of the same electrically conductive bonding material) during the electrical boding operation of each kind of electronic parts. Thus, it can contribute on the simplification of the manufacturing labor hour and the working labor can be reduced.

It is possible to appropriately set the shape of bottom surface 40 in accordance with the shape of land section 71 or so forth. As the shape of bottom surface 40 becomes larger, namely, as a fixture support area (a boding area between land section 71 and bottom surface section 40) with respect to land section 71 becomes larger, the connecting structure of second power supply terminals 35, 37 with respect to land section 71 becomes more stable, and a durability against the press fit of first power supply terminals 25, 3e between connection sections 43, for example, can be improved. In addition, the improvement of a motor efficiency due to the reduction of the electrical resistance is achieved and a generation of heat is suppressed. In addition, since penetrating holes 45 which penetrate through a thickness direction of bottom surface section 40 are formed, the electrically conductive bond material in a state having a comparatively soft characteristic such as liquefied or semi liquefied is easy to be filled in penetrating holes 45. An anchor effect can be obtained by solidifying the filled electrically conductive bond material (the filled electrically conductive bond material functions as anchor) and the connection structure can become more stable.

Figure 8:
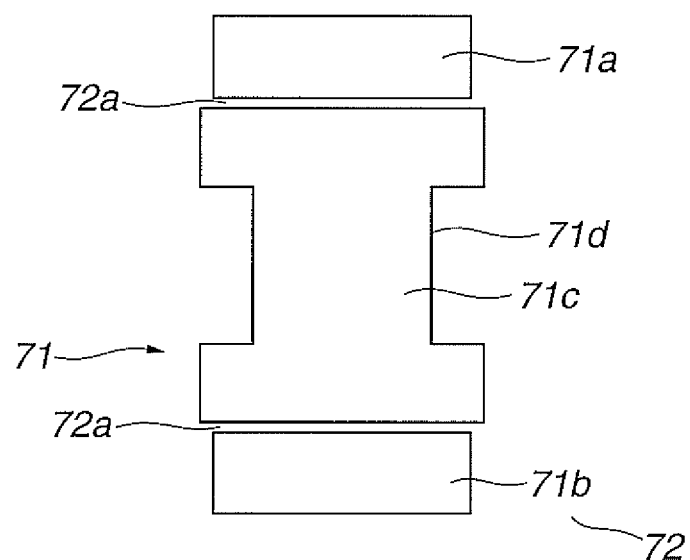
FIG. 8 is a plan view of a modification of each of the second power supply terminals.

Land section 71 may be structured in such a way that a mask 72 is interposed between both end sections 71a, 71b and center section 71c to form mask regions 72a, 72a, for example, as shown in FIG. 8. By electrically bonding bottom surface section 40 to land section 71 of such a structure as described above via the electrically conductive bonding material, the terminal press fit force is, for example, acted upon both end sections 40a, 40b in bottom surface section 40 so that, even if a crack is generated on the electrically conductive boding material positioned on both end sections 71a, 71b of land section 71, mask regions 72a, 72a suppress the crack from being developed to the electrical conductive bonding material. Thus, the connection reliability is easily maintained.

In addition, as shown in FIG. 8, a cut out section 71a may be formed on center section 71c of land section 71 to form a constriction shape. In this case, on bottom surface section 40, to meet with the shape of land section 71, a cut out section 41 may be formed on center section 40c of bottom surface section 40 to form the same constriction shape. In a case where the electrically conductive bond material intervened between the constriction shape land section 71 and bottom surface section 40 extends outside from the space between both of bottom surface section 40 and land section 71 in a state having the comparatively soft characteristic in a liquefied form or semi-liquefied form, the extended electrically conductive bond material easily returns to the space between both of bottom surface section 40 and land section 71 due to the action of a surface tension on the positions of cut out sections 41, 71d. Thus, even if a positional deviation between center section 40c of bottom surface section 40 and center section 71c of land section 71 occurs, both of bottom surface section 40 and land section 71 are easy to be displaced in the direction in which both of center sections 40c and 71c coincide with each other. Therefore, the positional deviation can be suppressed.

Figure 9:
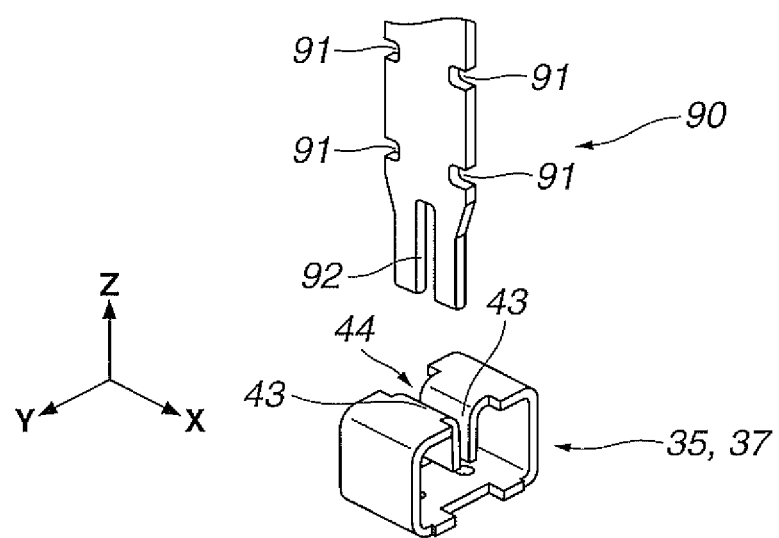
FIG. 9 is a perspective view of a modification of each of first power supply terminals.
Figure 10:
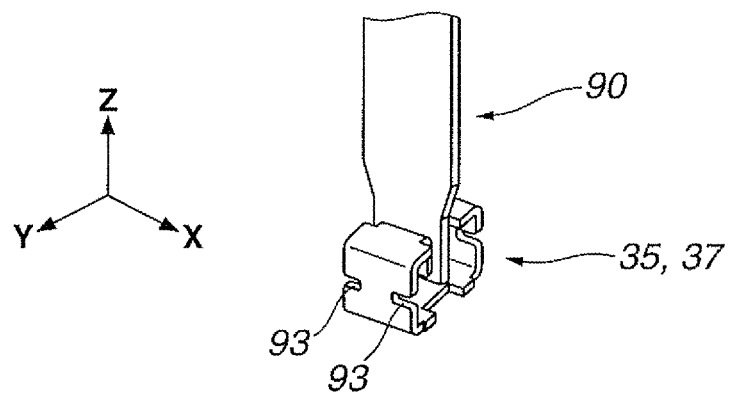
FIG. 10 is a perspective view of another modification of each of the second power supply terminals.

On one end section of each of first power supply terminals 25, 3e, for example, as one end section 90 shown in FIG. 9, a groove section 91 may be formed on a side end edge side of one end section 90 so that one end section 90 may easily be deformed in a Y direction of FIG. 9. Thus, even if a press fit angle when terminals 35, 37 are press fitted into gap section 44 between respective connection sections 43 is position deviated, one end section 90 is easily corrected in the Y direction in FIG. 9 so that the connection reliability is easily obtained. In addition, in a case where a groove section 92 is formed on a tip side of one end section 90, one end section 90 is easily elastically deformed with respect to X direction in FIG. 9 and with respect to a Z direction in FIG. 9. Even if the press fit angle is position deviated, one end section 90 is easily corrected in the X direction and Z direction so that the connection reliability can easily be obtained. It should be noted that even if, in the case of second power supply terminals 35, 37, for example, as shown in FIG. 10, a groove 93 may be formed on the side end edge side of bending section 42. Since this bending section 42 becomes elastically deformed, groove section 93 can contribute on the connection reliability.

It is possible to apply various materials to first power supply terminals 25, 3e and second power supply terminals 35, 37 if they can mutually electrically be connected. As specific examples, it is possible to apply the electrically conductive material such as a pure copper and having a ductility to first power supply terminals 25, 3e and to apply the electrically conductive material such as a phosphor bronze and having the elasticity to second power supply terminals 35, 37 to second power supply terminals 35, 37.

<<Others>>

The present invention is not limited to the structure of the preferred embodiment. Various modifications may be made within a range described in respective claims. For example, the present invention is applicable not only to electrically driven power steering device 1 but also to the electronic control device (electronic control unit) of electrically driven brake apparatus for the automotive vehicle and a variably operated valve apparatus for the internal combustion engine.

In addition, a binding of casing 5 and cover 6 can connect first power supply terminal 3e with a motor side terminal. This procedure will, herein, be explained. A substantial center sections of respective terminals 25 through 27 are bonded with resin sealed first connectors C1 through C3 inserted into mounting holes 29a of second connector 28. After this bonding operation, an adhesive (seal material) is applied to the gap between first connectors C1 through C3 and second connector 28 to strengthen a water resistance of the gap and a bonding force of first connectors C1 through C3 and second connector 28.

Next, electrical connector 9 is attached on the outer peripheral edge of opening section 10 of casing 5 and one end section of first power supply terminal 3e is connected to second power supply terminal 37 of drive circuit board 7. In this state, when casing 5 is attached on cover 6, one end section of first power supply terminal 25 is connected with second power supply terminal 35 and, at the same time, the other end section of first power supply terminal 3e is connected with the motor side terminal within motor housing 3c.

Technical ideas other than the invention described in each of the claims grasped from each preferred embodiment will be exemplified.

[Claim a] The electronic control device as claimed in any one of the claims 1 through 3, wherein the center section of the land section is formed to have a cut out section to have the land section a constriction shape.

[Claim b] The electronic control device as claimed in any one of the claims 1 through 3, wherein the bottom surface section has a penetrating hole penetrated in a thickness direction of the bottom surface section.

The invention claimed is:

1. An electronic control device in which a circuit board on which electronic parts are mounted is housed within a cabinet having bondable two cabinet members positioned mutually opposing directions, the circuit board being mounted on one of the cabinet members, the electronic control device comprising:

a first terminal disposed on the other of the cabinet members; and a second terminal mounted on the circuit board, the first terminal and the second terminal being connected by a bonding of the two cabinet members, the second terminal having: a bottom surface section fixed to a land section of the circuit board through an electrical bonding; a pair of bending sections which stand up from both end sides of the bottom surface section and bent in directions mutually approaching to each other; and a pair of connection sections formed on tip sides of the respective bending sections and positioned to oppose against each other and a tip side of the first terminal being press fitted into a space between the pair of connection sections from a stand up direction side of the bending sections to be connected to the pair of connection sections, wherein the land section includes both end sections and a center section, mask regions are formed between each of both end sections and the center section, and an electrically conductive bonding material is intervened between the land section and the bottom surface section excluding the mask regions to carry out the electrical bonding between the land section and the bottom surface section.

2. The electronic control device as claimed in claim 1, wherein the respective bending sections include: a pair of stand up sections which stand up from both end sides of the bottom surface section and positioned to mutually face against each other; and extending sections which extend from tip sides of the respective stand up sections toward approaching directions of the bending sections.

\* \* \* \* \*